US008736812B2

(12) United States Patent
Xie et al.

(10) Patent No.: US 8,736,812 B2
(45) Date of Patent: May 27, 2014

(54) PROJECTION-TYPE PHOTOLITHOGRAPHY SYSTEM USING COMPOSITE PHOTON SIEVE

(75) Inventors: Changqing Xie, Beijing (CN); Nan Gao, Beijing (CN); Yilei Hua, Beijing (CN); Xiaoli Zhu, Beijing (CN); Hailiang Li, Beijing (CN); Lina Shi, Beijing (CN); Dongmei Li, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 239 days.

(21) Appl. No.: 13/375,102

(22) PCT Filed: Aug. 16, 2011

(86) PCT No.: PCT/CN2011/078453
§ 371 (c)(1),
(2), (4) Date: Nov. 29, 2011

(87) PCT Pub. No.: WO2013/023357
PCT Pub. Date: Feb. 21, 2013

(65) Prior Publication Data
US 2013/0044299 A1 Feb. 21, 2013

(51) Int. Cl.
G03B 27/42 (2006.01)

(52) U.S. Cl.
USPC ............................... 355/53; 349/29; 359/619

(58) Field of Classification Search
CPC ...... G02B 5/32; G02B 27/44; G02B 27/0025; G02B 27/4205; G02B 27/46; G02B 5/1842; G02B 5/1876
USPC ............................... 355/53; 349/29; 359/619
See application file for complete search history.

(56) References Cited

U.S. PATENT DOCUMENTS 4,210,391 A 7/1980 Cohen
4,945,551 A 7/1990 Makabe et al.
(Continued)

FOREIGN PATENT DOCUMENTS

CN 101470270 A 7/2009
CN 101561637 A 10/2009
(Continued)

OTHER PUBLICATIONS

Menon et al., "Photon-sieve lithography," J. Opt. Soc. Am. A/vol. 22, No. 2; Feb. 2005.
(Continued)

Primary Examiner — Steven H Whitesell Gordon
Assistant Examiner — Mesfin T Asfaw
(74) Attorney, Agent, or Firm — Kinney & Lange, P.A.

(57) ABSTRACT

The present disclosure relates to the field of micro-nano fabrication, and provides a projection-type photolithography system using a composite photon sieve. The system comprises: a lighting system, a mask plate, a composite photon sieve and a substrate, which are arranged in order. The lighting system is adapted to generate incident light and irradiate the mask plate with the incident light. The mask plate is adapted to provide an object to be imaged by the composite photon sieve, and the incident light reaches the composite photon sieve after passing through the mask plate. The composite photon sieve is adapted to perform imaging, by which a pattern on the mask plate is imaged on the substrate. The substrate is adapted to receive an image of the pattern on the mask plate imaged by the composite photon sieve. According to the present disclosure, because the composite photon sieve is used instead of a projection objective lens in a conventional projection-type photolithography system, the advantage of high efficiency in the conventional projection-type photolithography system can be reserved, and also photolithography can be performed in batches rapidly, so that photolithography efficiency can be improved. Meanwhile, costs can be effectively cut down and the system can be reduced in size.

9 Claims, 3 Drawing Sheets

(56) References Cited

U.S. PATENT DOCUMENTS

| | | | |
|---|---|---|---|
| 5,263,073 A | 11/1993 | Feldman | |
| 5,633,735 A | 5/1997 | Hunter, Jr. et al. | |
| 5,900,637 A | 5/1999 | Smith | |
| 6,960,773 B2 | 11/2005 | Menon et al. | |
| 7,368,744 B2 | 5/2008 | Mulkens | |
| 7,666,580 B2 | 2/2010 | Menon et al. | |
| 7,667,819 B2 | 2/2010 | Menon et al. | |
| 2004/0069957 A1* | 4/2004 | Menon et al. | 250/492.2 |
| 2005/0064347 A1* | 3/2005 | Wang | 430/322 |
| 2007/0019306 A1 | 1/2007 | Wu et al. | |
| 2007/0194254 A1 | 8/2007 | Mulkens | |

FOREIGN PATENT DOCUMENTS

| | | |
|---|---|---|
| CN | 101614961 A | 12/2009 |
| CN | 102043178 A | 5/2011 |
| CN | 102053295 A | 5/2011 |

OTHER PUBLICATIONS

Pan et al., "Composite Photon Sieve and Its Application in Large Aperture Imaging," Opto-Electronic Engineering, vol. 37, No. 4; Apr. 2010.

Xie et al., "Feasibility study of hard-x-ray nanofocusing above 20 KeV using compound photon sieves," Optics Letters, vol. 35, No. 23; Dec. 1, 2010.

Chinese Patent Cooperation Treaty Search Report dated Aug. 16, 2011.

Chinese Patent Cooperation Treaty Written Opinion dated Aug. 16, 2011.

Li et al., "Super-resolution Focus Property of Photon Sieves," Opto-Electronic Engineering, vol. 36, No. 3, Mar., 2009.

* cited by examiner

PROJECTION-TYPE PHOTOLITHOGRAPHY SYSTEM USING COMPOSITE PHOTON SIEVE

FIELD OF THE INVENTION

The present disclosure relates to the field of micro-nano fabrication, and specifically relates to a projection-type photolithography system using a composite photon sieve.

BACKGROUND OF THE INVENTION

Projection-type photolithography systems are widely used in current integrated circuit manufacturing processes, wherein a size-reduced image of a pattern on a mask plate is projected on a substrate surface using a projection objective lens and then the pattern is transferred by means of other processing steps. A core structure of an existing projection-type photolithography system is shown in FIG. 1, comprising a lighting system 1, a mask plate 2, a projection objective lens 3, and a substrate 4. The lighting system 1 is located at the top of the system, and functions as an incident light source of high quality. The mask plate 2 is located below the lighting system 1, and provides an object to be imaged by the projection objective lens. The projection objective lens 3 is located below the mask plate 2, and performs imaging. The substrate 4 is located below the projection objective lens 3, and receives the result of imaging and then is used in subsequent processing steps. Distances between the mask plate 2, the projection objective lens 3, and the substrate 4 satisfy the object-image relationship in lens imaging.

The projection objective lens requires a very large numerical aperture and a very high imaging quality in order to achieve a high imaging resolution, because the imaging resolution is proportional to the numerical aperture of the projection objective lens, and meanwhile aberrations of the lens will reduce the imaging resolution significantly. These propose harsh requirements to the designing, processing and assembling process of a projection objective lens system having a large numerical aperture and a weight of over one ton.

In contrast to the projection-type photolithography systems, direct writing photolithography systems do not need a mask plate, but instead utilize focusing elements to obtain very small light spots, such that a pattern is formed directly on a substrate. Zone plate maskless direct writing systems and photon sieve maskless direct writing systems utilize a zone plate and a photon sieve as the focusing element, respectively, to obtain the very small light spots. Because the zone plate and the photon sieve are used instead of the complex and costly projection objective lens, the zone plate maskless direct writing systems and the photon sieve maskless direct writing systems both can effectively reduce manufacturing cost as well as volumes of the photolithography systems.

However, both the zone plate maskless direct writing systems and the photon sieve maskless direct writing systems belong to the direct writing photolithography systems, making them incapable of performing photolithography in batches rapidly by using the mask plate, and thus their efficiencies are much lower than that of the projection-type photolithography systems.

SUMMARY OF THE INVENTION

In view of the foregoing facts, the present disclosure, among other things, provides a projection-type photolithography system using a composite photon sieve to perform photolithography in batches rapidly, improve efficiency of photolithography, cut down costs, and reduce a system volume.

The present disclosure provides a projection photolithography system using a composite photon sieve, the system comprising: a lighting system 1, a mask plate 2, a composite photon sieve 3 and a substrate 4, which are arranged in order. The lighting system 1 is adapted to generate incident light and irradiate the mask plate 2 with the incident light. The mask plate 2 is adapted to provide an object to be imaged by the composite photon sieve 3, and the incident light reaches the composite photon sieve 3 after passing through the mask plate 2. The composite photon sieve 3 is adapted to perform imaging, by which a pattern on the mask plate 2 is imaged on the substrate 4. The substrate 4 is adapted to receive an image of the pattern on the mask plate 2 imaged by the composite photon sieve 3.

The composite photon sieve 3 may comprise a transparent base substrate and a light-proof metal film plated on the transparent base substrate. The metal film may have a series of transparent annular zones and a plurality of transparent holes distributed thereon. The plurality of transparent holes can constitute a first order diffractive photon sieve portion of the composite photon sieve 3, and the series of transparent annular zones can constitute a third order diffractive zone plate portion of the composite photon sieve 3. All of the transparent holes are enclosed by one of the transparent annular zones with a minimum radius.

The transparent holes are planar transparent holes, which are distributed randomly on a plurality of annular zones, each of which has an inner-radius of $r_n$ and an outer radius of $r_n'$. All of the transparent holes are not overlapped with each other and are arranged densely or sparsely. The transparent holes may have their centers fall on central lines of the respective annular zones. Here, $$r_n^2 = 2n\lambda f + n^2\lambda^2,$$

$$r_n'^2 = (2n+1)\lambda f + \frac{1}{4}(2n+1)^2\lambda^2,$$

wherein:
n=1, 2, ... N;
$\lambda$ is a focal length of the composite photon sieve 3;
f is a focal length of the composite photon sieve 3;
N is a total number of the annular zones of the inner first order diffractive photon sieve, and is a natural number satisfying $d_N \geq \Delta r$ and $d_{N+1} < \Delta r$;
$\Delta r$ is a minimum linewidth allowed by a manufacturing process; and
$d_n$ is a diameter of each of the transparent holes on the $n^{th}$ annular zone, given by $d_n = 1.5(r_n' - r_n)$.

The transparent annular zones are planar annular zones, and each has an inner-radius of $r_m$ and an outer radius of $r_m'$ and thus a width $w_m$ of $w_m = r_m' - r_m$.

Here, $$r_m^2 = (2N - 2 + 6m)\lambda f + \frac{1}{4}(2N - 2 + 6m)^2\lambda^2, \text{ and}$$

$$r_m'^2 = (2N - 2 + 6m + 3)\lambda f + \frac{1}{4}(2N - 2 + 6m + 3)^2\lambda^2,$$

wherein:
m=1, 2. ... M;
$\lambda$ is a wavelength of the incident light generated by the lighting system 1;

f is a focal length of the composite photon sieve 3;

M is a total number of the transparent annular zones of the outer third order diffractive zone plate, and is a natural number satisfying $w_M \geq \Delta r$ and $w_{M+1} < \Delta r$; and $\Delta r$ is a minimum linewidth allowed by a manufacture process.

The transparent base substrate may be made of a transparent material, which comprises one of fused quartz, ordinary glass, and organic glass. The light-proof metal film may comprise one of chromium, gold, aluminum, and copper, and may have a thickness large enough to completely block the incident light.

The composite photon sieve 3 may have its surface, on which the metal film is disposed, face the substrate 4. A distance s between the mask plate 2 and the composite photon sieve 3 and a distance v between the composite photon sieve 3 and the substrate 4 satisfy the object-image relationship, namely:

$$\frac{1}{s} + \frac{1}{v} = \frac{1}{f},$$

wherein f is a focal length of the composite photon sieve 3.

According to the embodiments, the present disclosure can provide, at least or in part, the following beneficial effects.

The projection-type photolithography system using the composite photon sieve according to the present disclosure uses the composite photon sieve instead of a projection objective lens in a conventional projection-type photolithography system. Therefore, the advantage of high efficiency in the conventional projection-type photolithography system can be reserved, and photolithography can be performed in batches rapidly, so that photolithography efficiency can be improved. Meanwhile, costs can be effectively cut down and the system can be reduced in size.

Further, compared with the conventional projection objective lens, the projection-type photolithography system using the composite photon sieve according to the present disclosure uses the composite photon sieve which only comprises the transparent substrate and the metal film, and hence has advantages of compactness, light in weight and low manufacturing cost. Meanwhile, aberration characteristics of the photon sieve are better than those of the conventional projection objective lens.

Further, compared with a maskless direct writing photolithography system based on a zone plate or a photon sieve, the projection-type photolithography system using the composite photon sieve according to the present disclosure can perform the photolithography in batches using the mask plate, and therefore has an advantage of high efficiency.

Furthermore, in the projection-type photolithography system using the composite photon sieve according to the present disclosure, the inner portion of the composite photon sieve utilizes a first order diffractive photon sieve design, and the outer portion thereof utilizes a third order diffractive zone plate. Such a structure can improve an SNR (Signal-to-Noise Ratio) by the photon sieve in the inner portion. Furthermore, the composite photon sieve has its area increased by incorporating the third order diffractive zone plate in the outer portion. As a result, compared with a single zone plate or a single photon sieve, a numerical aperture and the SNR can be further improved under identical characteristic dimensions.

DETAILED DESCRIPTION OF PREFERRED EMBODIMENTS

Figure 1:
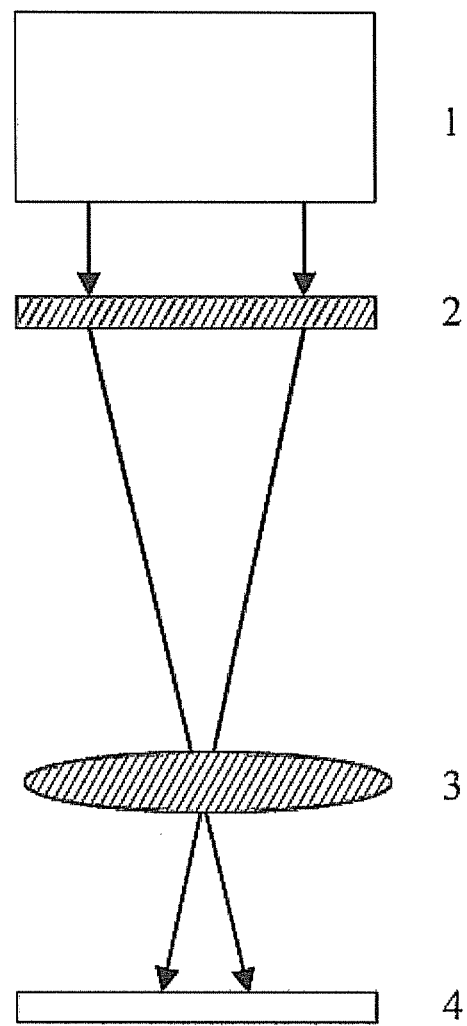
FIG. 1 is a schematic view showing a structure of an existing projection-type photolithography system.

The present disclosure will be further explained in detail in connection with specific embodiments and with reference to the drawings, and thereby objects, technical solutions, and advantages of the present disclosure will become apparent.

A projection-type photolithography system using a composite photon sieve according to the present disclosure utilizes the composite photon sieve instead of a projection objective lens in a conventional projection photolithography system. The system comprises a lighting system 1, a mask plate 2, a composite photon sieve 3 and a substrate 4, which are arranged in order. The lighting system 1 is adapted to generate incident light and irradiate the mask plate 2 with the incident light. The mask plate 2 is adapted to provide an object to be imaged by the composite photon sieve 3. The incident light reaches the composite photon sieve 3 after passing through the mask plate 2. The composite photon sieve 3 is adapted to achieve imaging, by which a pattern on the mask plate 2 is imaged on the substrate 4. The substrate 4 is adapted to display the image of the pattern on the mask plate 2 imaged by the composite photon sieve 3.

The composite photon sieve 3 comprises a transparent base substrate and a light-proof metal film plated on the transparent base substrate. The transparent base substrate is made of a transparent material, such as fused quartz, ordinary glass, and organic glass. The light-proof metal film is made of, for example, any one of chromium, gold, aluminum, and copper, with a thickness larger than 80 nm.

There are a series of transparent annular zones and a plurality of transparent holes distributed on the metal film. The plurality of transparent holes constitute a first order diffractive photon sieve portion of the composite photon sieve 3, and the series of transparent annular zones constitute a third order diffractive zone plate portion of the composite photon sieve 3. All of the transparent holes are enclosed by one of the transparent annular zones with a minimum radius.

The transparent holes are planar transparent holes, which are distributed randomly on a plurality of annular zones, each of which has an inner-radius of $r_n$ and an outer radius of $r_n'$. All of the transparent holes are not overlapped with each other and are arranged densely or sparsely. The transparent holes have their centers fall on central lines of the respective annular zones. Here, $$r_n^2 = 2n\lambda f + n^2\lambda^2,$$

$$r_n'^2 = (2n+1)\lambda f + \frac{1}{4}(2n+1)^2\lambda^2,$$

wherein:

n=1, 2, . . . N;

$\lambda$ is a wavelength of the incident light generated by the lighting system 1;

f is a focal length of the composite photon sieve 3;

N is a total number of the annular zones of the inner first order diffractive photon sieve, and is a natural number satisfying $d_N \geq \Delta r$ and $d_{N+1} < \Delta r$;

$\Delta r$ is a minimum linewidth allowed by a manufacturing process; and $d_n$ is a diameter of each of the transparent holes on the $n^{th}$ annular zone, given by $d_n = 1.5(r'_n - r_n)$.

The transparent annular zones are planar annular zones, and each has an inner-radius of $r_m$ and an outer radius of $r_m'$, and thus a width $w_m$ of $w_m = r_m' - r_m$.

Here, $$r_m^2 = (2N - 2 + 6m)\lambda f + \frac{1}{4}(2N - 2 + 6m)^2 \lambda^2, \text{ and}$$

$$r_m'^2 = (2N - 2 + 6m + 3)\lambda f + \frac{1}{4}(2N - 2 + 6m + 3)^2 \lambda^2,$$

wherein:

m=1, 2. . . M;

$\lambda$ is the wavelength of the incident light generated by the lighting system 1;

f is the focal length of the composite photon sieve 3;

M is a total number of the transparent annular zones of the outer third order diffractive zone plate, and is a natural number satisfying $w_M \geq \Delta r$ and $w_{M+1} < \Delta r$; and $\Delta r$ is the minimum linewidth allowed by the manufacture process.

Furthermore, in the arrangement of the light system 1, the mask plate 2, the composite photo sieve 3, and the substrate 4, a surface of the composite photon sieve 3, which has the metal film provided thereon, is placed to face the substrate 4. A distance s between the mask plate 2 and the composite photon sieve 3 and a distance v between the composite photon sieve 3 and the substrate 4 satisfy the object-image relationship, namely:

$$\frac{1}{s} + \frac{1}{v} = \frac{1}{f},$$

wherein f is the focal length of the composite photon sieve 3.

Figure 2:
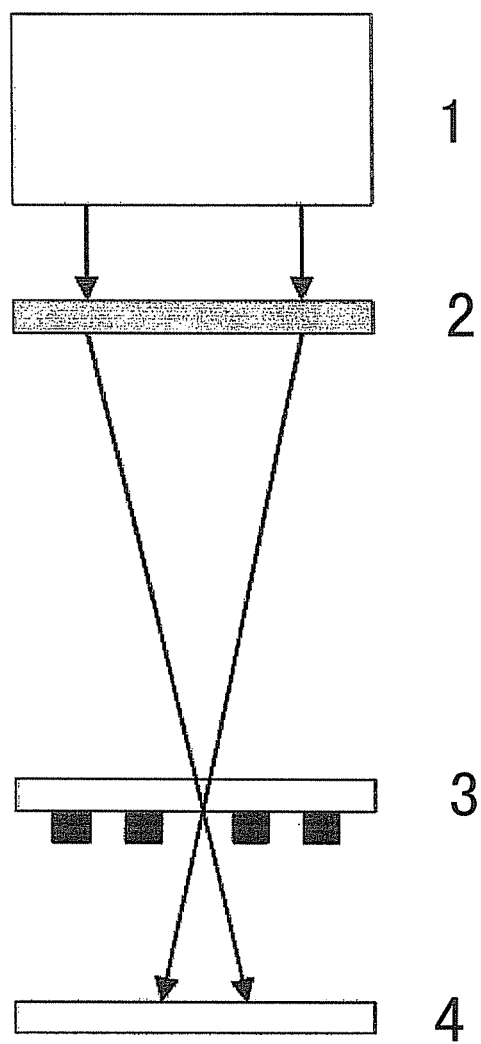
FIG. 2 is a schematic view showing a structure of a projection-type photolithography system using a composite photon sieve according to a first embodiment of the present disclosure.

The projection-type photolithography system using the composite photon sieve according to the present disclosure is described in principle above. FIG. 2 is a schematic view showing a structure of a projection-type photolithography system using a composite photon sieve according to a first embodiment of the present disclosure. The system comprises: a lighting system 1, a mask plate 2, a composite photon sieve 3 and a substrate 4. The lighting system 1 may comprise a laser of 193 nm and a corresponding expanding and collimating system so as to constitute an incident light source of high quality. The mask plate 2 may comprise a mask plate commonly used in the integrated circuit manufacturing process of 193 nm. For example, the mask plate 2 may comprise a transparent glass substrate and a light-proof metal film plated on the transparent substrate, to provide an object to be imaged by the photon sieve. The composite photon sieve 3 may comprise a transparent substrate and a light-proof metal film plated on the transparent substrate to perform imaging. The substrate 4 may comprise silicon and photoresist coating applied on the silicon surface, to receive a resulting image and also following processing steps.

In the present embodiment, the lighting system 1 is located at the top of the system and is adapted to generate the incident light source of high quality. The mask plate 2 is located below the lighting system 1 and is adapted to provide the object to be imaged by the photo sieve. The projection objective lens 3 is located below the mask plate 2 and adapted to perform imaging. The substrate 4 is located below the composite photon sieve 3 and adapted to receive the resulting image and is used in subsequent processing steps. Distances between the mask plate 2, the composite photon sieve 3 and the substrate 4 satisfy the object-image relationship in lens imaging. The composite photon sieve 3 needs to be placed reversely, that is, has its surface on which the metal film is placed face the substrate 4.

In the present embodiment, a distance s between the mask plate 2 and the composite photon sieve 3 and a distance v between the composite photon sieve and the substrate should meet the object-image relationship, namely:

$$\frac{1}{s} + \frac{1}{v} = \frac{1}{f},$$

wherein f is a focal length of the composite photon sieve and is optionally 100 μm, s is optionally 500 μm, and v is optionally 125 μm, for example.

Figure 3:
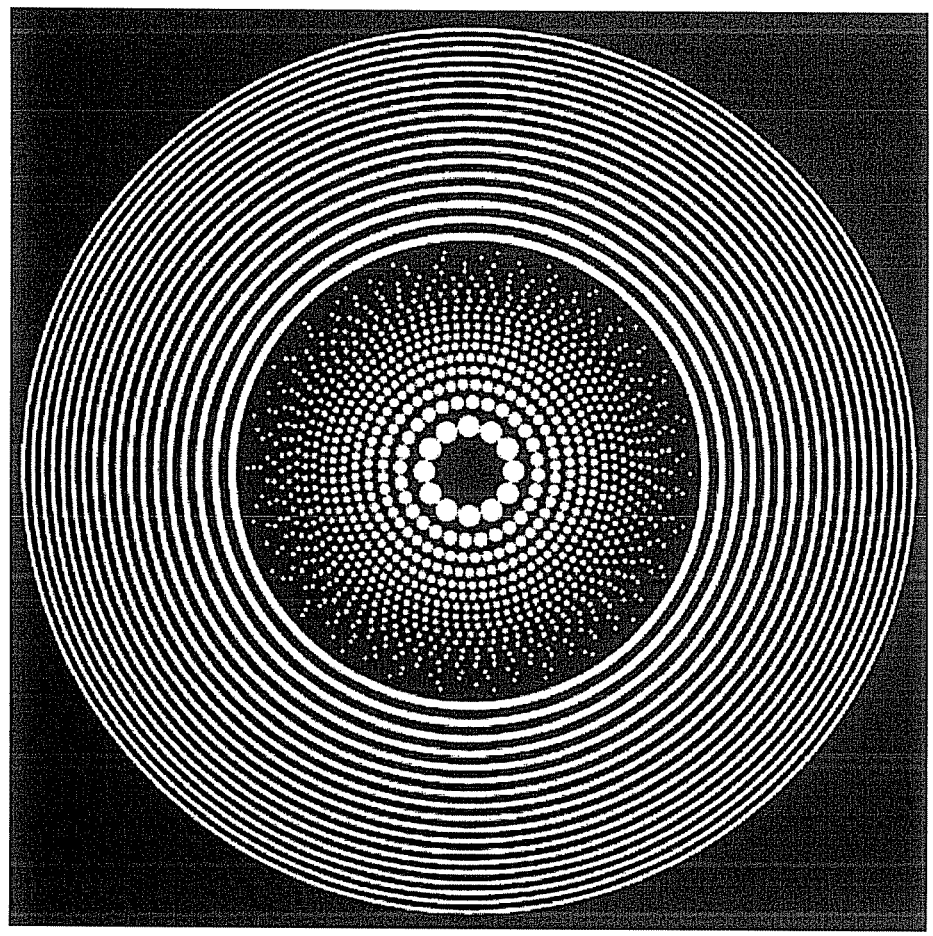
FIG. 3 is a schematic view showing the composite photon sieve in the projection-type photolithography system using the composite photon sieve according to the first embodiment of the present disclosure.

In the above solution, the composite photon sieve comprises the transparent substrate and the light-proof metal film plated on the transparent substrate. The transparent substrate may comprise quartz with a diameter of one inch and a thickness of 100 μm. The light-proof metal film may comprise chromium with a thickness of 80 nm. There are a series of transparent annular zones and a plurality of transparent holes distributed on the metal film, as shown in FIG. 3. Here, black regions indicate the light-proof metal film, and white regions indicate the transparent annular zones and the transparent holes. All of these transparent holes are enclosed by one of the transparent annular zones with a minimum radius. The transparent holes constitute an inner portion of the composite photon sieve, i.e., a first order diffractive photon sieve portion. The transparent annular zones constitute an outer portion of the composite photon sieve, i.e., a third order diffractive zone plate portion.

The transparent holes are planar transparent holes, which are distributed randomly on a plurality of annular zones, each of which has an inner-radius of $r_n$ and an outer radius of $r_n'$. All of the transparent holes are not overlapped with each other and can be arranged densely or sparsely. The transparent holes have their centers fall on central lines of the respective annular zones. Here, $$r_n^2 = 2n\lambda f + n^2 \lambda^2,$$

$$r_n'^2 = (2n + 1)\lambda f + \frac{1}{4}(2n + 1)^2 \lambda^2,$$

n=1, 2, . . .N;

$\lambda$ is a wavelength of the incident light generated by the lighting system;

f is a focal length of the composite photon sieve;

N is a total number of the annular zones of the inner first order diffractive photon sieve. Each of the transparent holes on the $n^{th}$ annular zone has a diameter $d_n$ of $d_n = 1.5(r_n' - r_n)$. The total number N of the annular zones of the inner first order diffractive photon sieve is a natural number satisfying $d_N \geq \lambda r$ and $d_{N+1} < \Delta r$, wherein $\Delta r$ is a minimum linewidth allowed by a manufacturing process. For example, λ may be 193 nm, and f may be 100 μm.

The transparent annular zones are planar annular zones, and each have an inner-radius of $r_m$ and an outer radius of $r_m'$. Here, $$r_m^2 = (2N - 2 + 6m)\lambda f + \frac{1}{4}(2N - 2 + 6m)^2 \lambda^2,$$

$$r_m'^2 = (2N - 2 + 6m + 3)\lambda f + \frac{1}{4}(2N - 2 + 6m + 3)^2 \lambda^2,$$

$$(m = 1, 2 \ldots M),$$

wherein:
λ is the wavelength of the incident light generated by the lighting system;
f is the focal length of the composite photon sieve; and
M is a total number of the transparent annular zones of the outer third order diffractive zone plate.

Each of the transparent annular zone has a width $w_m$ of $w_m = r_m' - r_m$. The total number M of the transparent annular zones of the outer third order diffractive zone plate is a natural number satisfying $w_M \geq \Delta r$ and $w_{M+1} < \Delta r$, wherein Δr is the minimum linewidth allowed by the manufacture process, and is optionally 300 nm, for example. Thus, the total number N of the annular zones of the photon sieve portion equals to 73, and the total number M of the transparent annular zones of the zone plate portion equals to 461, for example.

Figure 4:
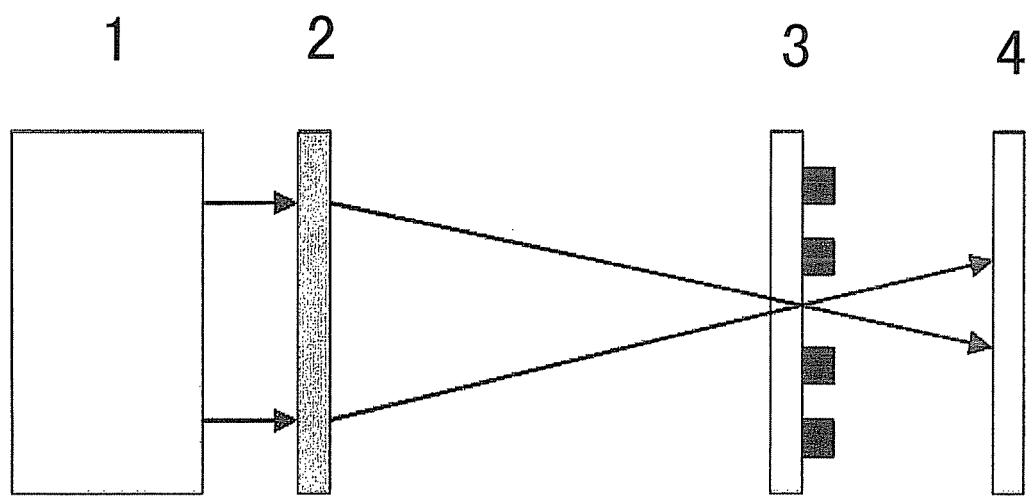
FIG. 4 is a schematic view showing a structure of a projection-type photolithography system using a composite photon sieve according to a second embodiment of the present disclosure.

In the above embodiments, the lighting system 1, the mask plate 2, the composite photon sieve 3 and the substrate 4 are disposed from top to bottom in order. In practical applications, the lighting system 1, the mask plate 2, the composite photon sieve 3 and the substrate 4 can also be disposed in any direction in order. For example, as shown in FIG. 4, they can be disposed horizontally from left to right in order, as long as the distance s between the mask plate 2 and the composite photon sieve and the distance v between the composite photon sieve and substrate satisfy the object-image relationship $$\frac{1}{s} + \frac{1}{v} = \frac{1}{f}.$$

The objects, technical solutions and beneficial effects of the present disclosure have been further explained in detail in connection with the above specific embodiments. It should be understood that all of the above are only specific embodiments of the present disclosure but do not constitute a restriction to the present disclosure. Any modification, equivalent substitution, and improvement, etc., within the spirit and principle of the present disclosure should be included in the protection scope of the present disclosure.

What is claimed is:

1. A projection-type photolithography system using a composite photon sieve, the system comprising: a lighting system, a mask plate, a composite photon sieve and a substrate, which are arranged in order, wherein:
   the lighting system is adapted to generate incident light and irradiate the mask plate with the incident light;
   the mask plate is adapted to provide an object to be imaged by the composite photon sieve, and the incident light reaches the composite photon sieve after passing through the mask plate;
   the composite photon sieve is adapted to perform imaging, by which a pattern on the mask plate is imaged on the substrate;
   the substrate is adapted to receive an image of the pattern on the mask plate imaged by the composite photon sieve; and
   the composite photon sieve has a series of transparent annular zones and a plurality of transparent holes distributed thereon, wherein the plurality of transparent holes constitute a first order diffractive photon sieve portion of the composite photon sieve, and the series of transparent annular zones constitute a third order diffractive zone plate portion of the composite photon sieve.

2. The projection-type photolithography system using the composite photon sieve according to claim 1, wherein the composite photon sieve comprises a transparent base substrate and a light-proof metal film plated on the transparent base substrate.

3. The projection-type photolithography system using the composite photon sieve according to claim 2, wherein the transparent base substrate is made of a transparent material, which comprises one of fused quartz, ordinary glass, and organic glass.

4. The projection-type photolithography system using the composite photon sieve according to claim 2, wherein the light-proof metal film comprises one of chromium, gold, aluminum, and copper, and has a thickness large enough to completely block the incident light.

5. The projection-type photolithography system using the composite photon sieve according to claim 1, wherein all of the plurality of transparent holes are enclosed by one of the transparent annular zones with a minimum radius.

6. The projection-type photolithography system using the composite photon sieve according to claim 1, wherein:
   the transparent holes are planar transparent holes, which are distributed randomly on a plurality of annular zones, each of which has an inner-radius of $r_n$ and an outer radius of $r_n'$;
   all of the transparent holes are not overlapped with each other and are arranged densely or sparsely; and
   the transparent holes have their centers fall on central lines of the respective annular zones, wherein:

$$r_n^2 = 2n\lambda f + n^2\lambda^2; \text{ and}$$

$$r_n'^2 = (2n+1)\lambda f + \frac{1}{4}(2n+1)^2\lambda^2,$$

wherein:
n=1, 2, . . . N;
λ is a wavelength of the incident light generated by the lighting system;
f is a focal length of the composite photon sieve;
N is a total number of the annular zones of the inner first order diffractive photon sieve, and is a natural number satisfying $d_N \geq \Delta r$ and $d_{N+1} < \Delta r$;
Δr is a minimum linewidth allowed by a manufacturing process; and
$d_n$ is a diameter of each of the transparent holes on the $n^{th}$ annular zone, given by $d_n = 1.5(r_n' - r_n)$.

7. The projection-type photolithography system using the composite photon sieve according to claim 1, wherein the transparent annular zones are planar annular zones, and each has an inner-radius of $r_m$ and an outer radius of $r_m'$, and thus a width $W_m$ of $W_m = r_m' - r_m$, wherein:

$$r_m^2 = (2N - 2 + 6m)\lambda f + \frac{1}{4}(2N - 2 + 6m)^2\lambda^2; \text{ and}$$

$$r_m'^2 = (2N - 2 + 6m + 3)\lambda f + \frac{1}{4}(2N - 2 + 6m + 3)^2\lambda^2,$$

wherein:
m=1, 2...M;
λ is a wavelength of the incident light generated by the lighting system;

f is a focal length of the composite photon sieve;

M is a total number of the transparent annular zones of the outer third order diffractive zone plate, and is a natural number satisfying $w_M \geq \Delta r$ and $w_{M+1} < \Delta r$; and $\Delta r$ is a minimum linewidth allowed by a manufacture process.

8. The projection-type photolithography system using the composite photon sieve according to claim 1, wherein the composite photon sieve has its surface, on which the metal film is disposed, face the substrate.

9. The projection-type photolithography system using the composite photon sieve according to claim 1, wherein a distance s between the mask plate and the composite photon sieve and a distance v between the composite photon sieve and the substrate satisfy the object-image relationship, namely:

$$\frac{1}{s} + \frac{1}{v} = \frac{1}{f},$$

wherein f is a focal length of the composite photon sieve.

* * * * *